(12) United States Patent
Wang et al.

(10) Patent No.: US 11,817,497 B2
(45) Date of Patent: Nov. 14, 2023

(54) VERTICAL FIELD EFFECT TRANSISTOR INVERTER WITH SINGLE FIN DEVICE

(71) Applicant: International Business Machines Corporation, Armonk, NY (US)

(72) Inventors: Junli Wang, Slingerlands, NY (US); Ruilong Xie, Niskayuna, NY (US); Alexander Reznicek, Troy, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 17/445,832

(22) Filed: Aug. 25, 2021

(65) Prior Publication Data

US 2023/0073990 A1     Mar. 9, 2023

(51) Int. Cl.
*H01L 29/78* (2006.01)
*H01L 29/06* (2006.01)
*H01L 29/66* (2006.01)

(52) U.S. Cl.
CPC ........ *H01L 29/7827* (2013.01); *H01L 29/063* (2013.01); *H01L 29/66666* (2013.01); *H01L 29/66818* (2013.01); *H01L 29/785* (2013.01)

(58) Field of Classification Search
CPC ............. H01L 29/063; H01L 29/66666; H01L 29/66818; H01L 29/785; H01L 21/823871; H01L 21/823885; H01L 27/092; H01L 29/41741; H01L 27/11273; H01L 21/823487; H01L 29/66712–66734; H01L 29/7802–7815; H01L 29/7827–7828;

(Continued)

(56) References Cited

U.S. PATENT DOCUMENTS

| 4,941,028 A | 7/1990 | Chen |
| 8,415,744 B2 | 4/2013 | Cai et al. |
| 9,761,726 B1 | 9/2017 | Balakrishnan |

(Continued)

FOREIGN PATENT DOCUMENTS

| CN | 110729192 A | 1/2020 |
| JP | 08115927 A | 5/1996 |
| JP | 2004165387 A | 6/2004 |

OTHER PUBLICATIONS

"Patent Cooperation Treaty PCT Notification of Transmittal of the International Search Report and the Written Opinion of the International Searching Authority, or the Declaration", Applicant's file reference F22W2362, International application No. PCT/CN2022/104388, International filing date Jul. 7, 2022 (Jul. 7, 2022), dated Sep. 30, 2022 (Sep. 30, 2022), 10 pages.

*Primary Examiner* — Cuong B Nguyen
(74) *Attorney, Agent, or Firm* — Gavin Giraud

(57) ABSTRACT

Embodiments of the invention include a vertical field-effect transistor (VTFET) inverter. The VTFET inverter may include a p-channel field-effect transistor (P-FET) with a P-FET top source/drain and a P-FET bottom source/drain. The VTFET inverter may also include an n-channel field-effect transistor (N-FET) comprising an N-FET top source/drain and a N-FET bottom source/drain. The VTFET inverter may also include a buried contact located at a boundary between the P-FET bottom source/drain and the N-FET bottom source/drain. The VTFET inverter may also include a Vout contact electrically connected to one of the P-FET bottom source/drain and the N-FET bottom source/drain.

7 Claims, 14 Drawing Sheets

(58) Field of Classification Search
CPC ............. H01L 29/78642; H01L 51/057; H01L 27/2454
See application file for complete search history.

(56) References Cited

U.S. PATENT DOCUMENTS

| | | |
|---|---|---|
| 9,831,317 B1 | 11/2017 | Zang |
| 10,103,247 B1 | 10/2018 | Xie |
| 10,109,637 B1 | 10/2018 | Zang |
| 10,134,739 B1 | 11/2018 | Zang |
| 10,770,585 B2 | 9/2020 | Xie |
| 10,796,957 B2 | 10/2020 | Fan |
| 10,944,012 B2 | 3/2021 | Reznicek |
| 2005/0017289 A1 | 1/2005 | Kim |
| 2009/0302392 A1 | 12/2009 | Slesazeck |
| 2010/0052055 A1 | 3/2010 | Takeuchi |
| 2010/0219482 A1* | 9/2010 | Masuoka ............... H10B 10/15 257/369 |

* cited by examiner

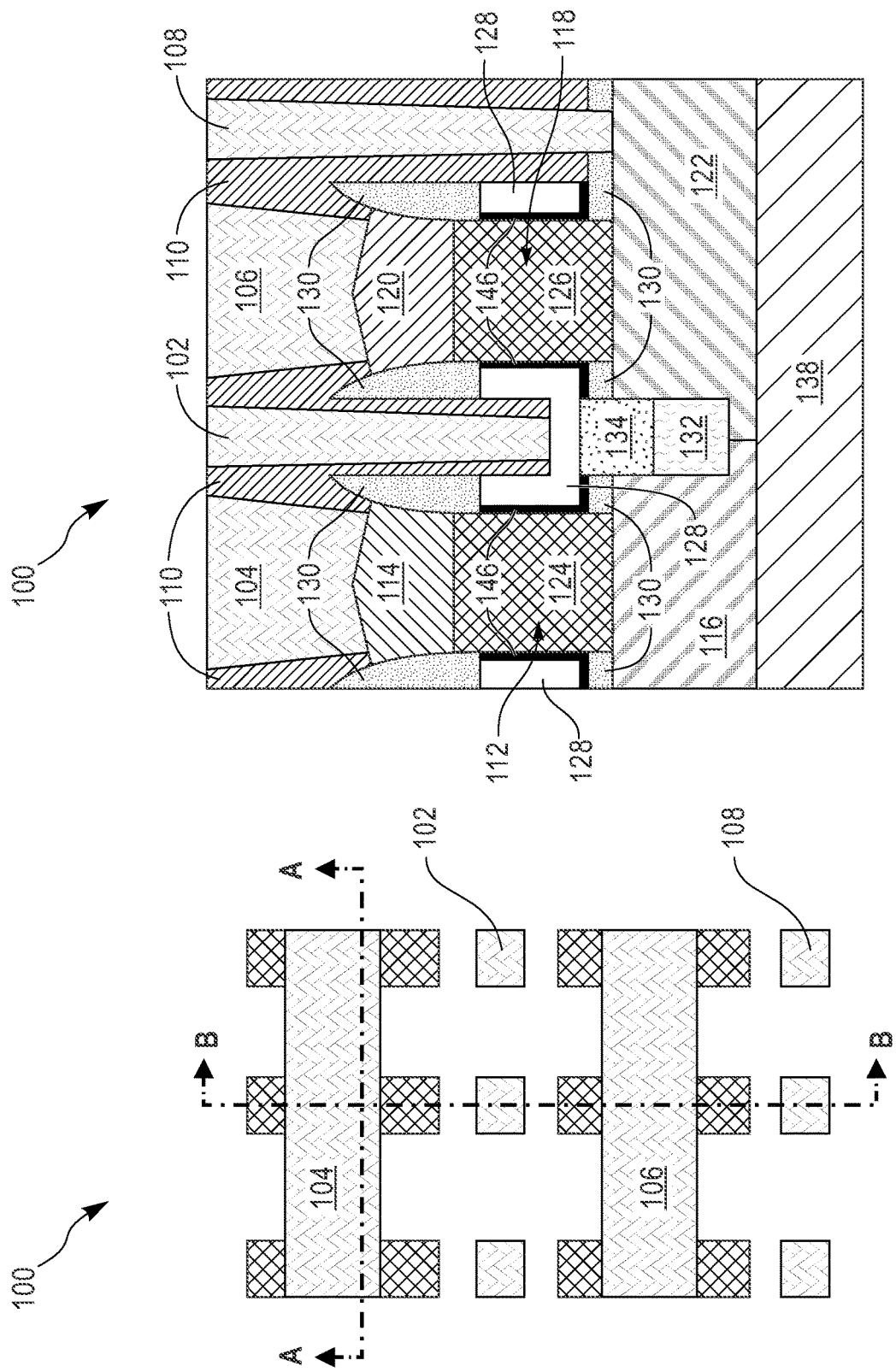

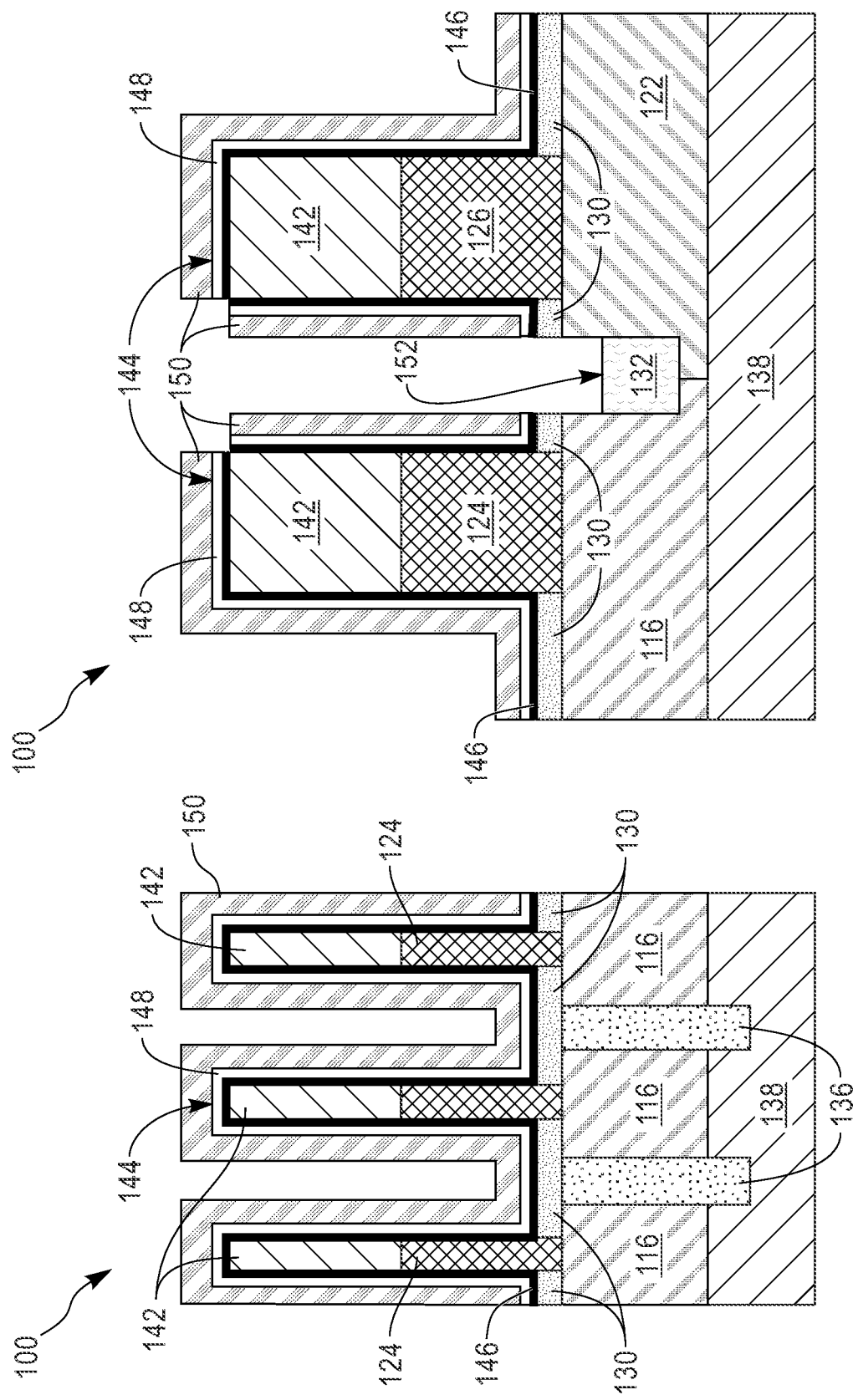

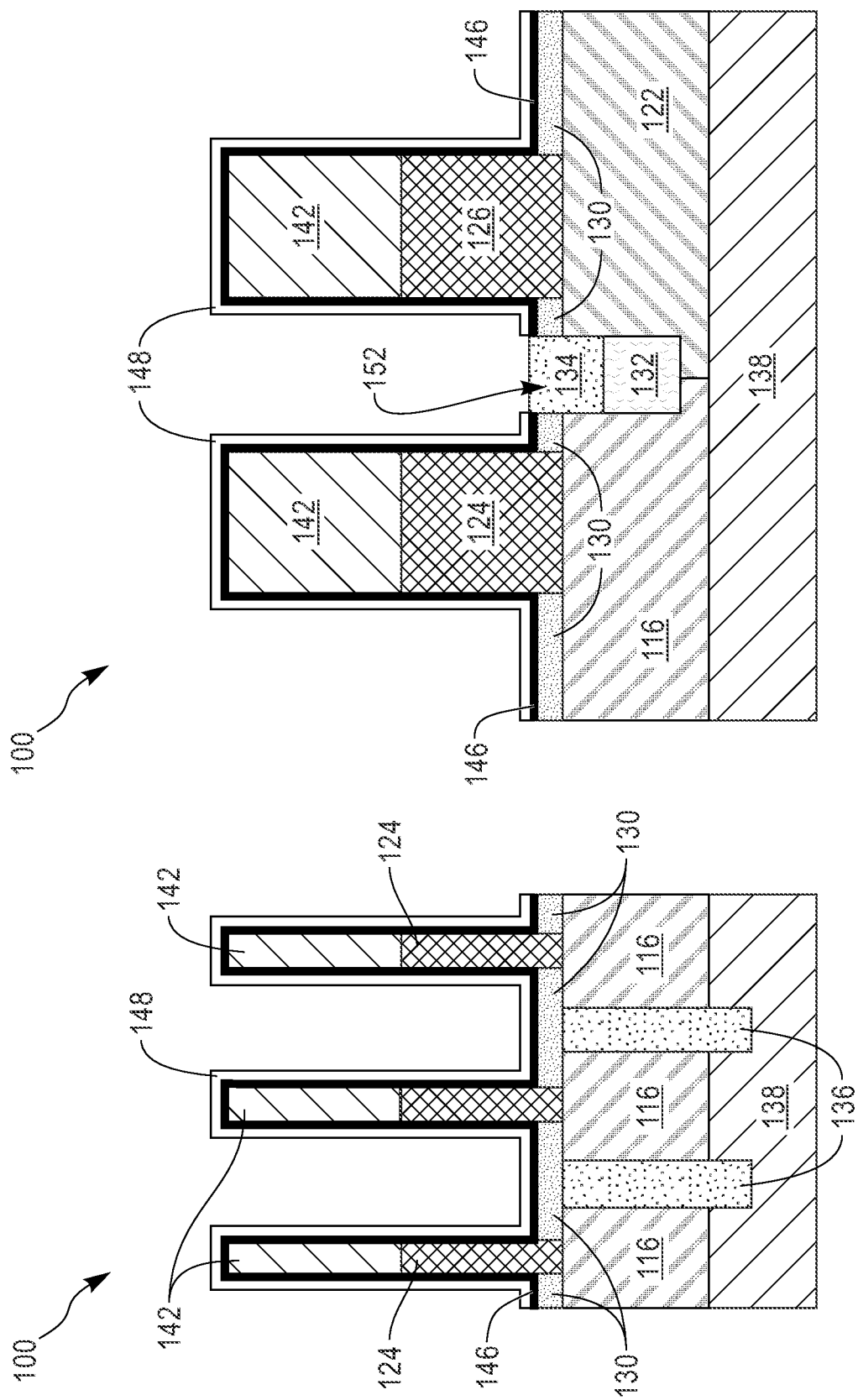

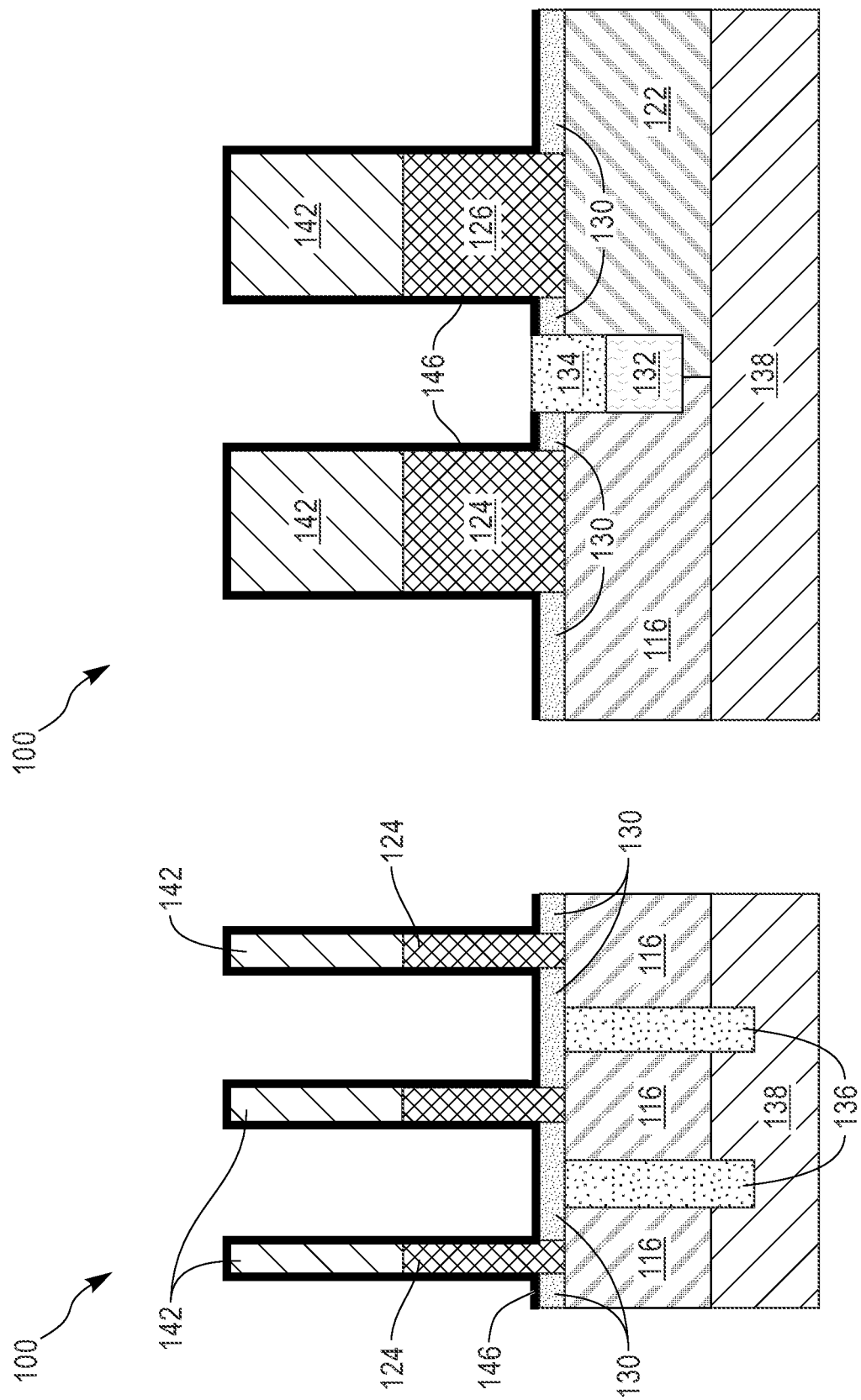

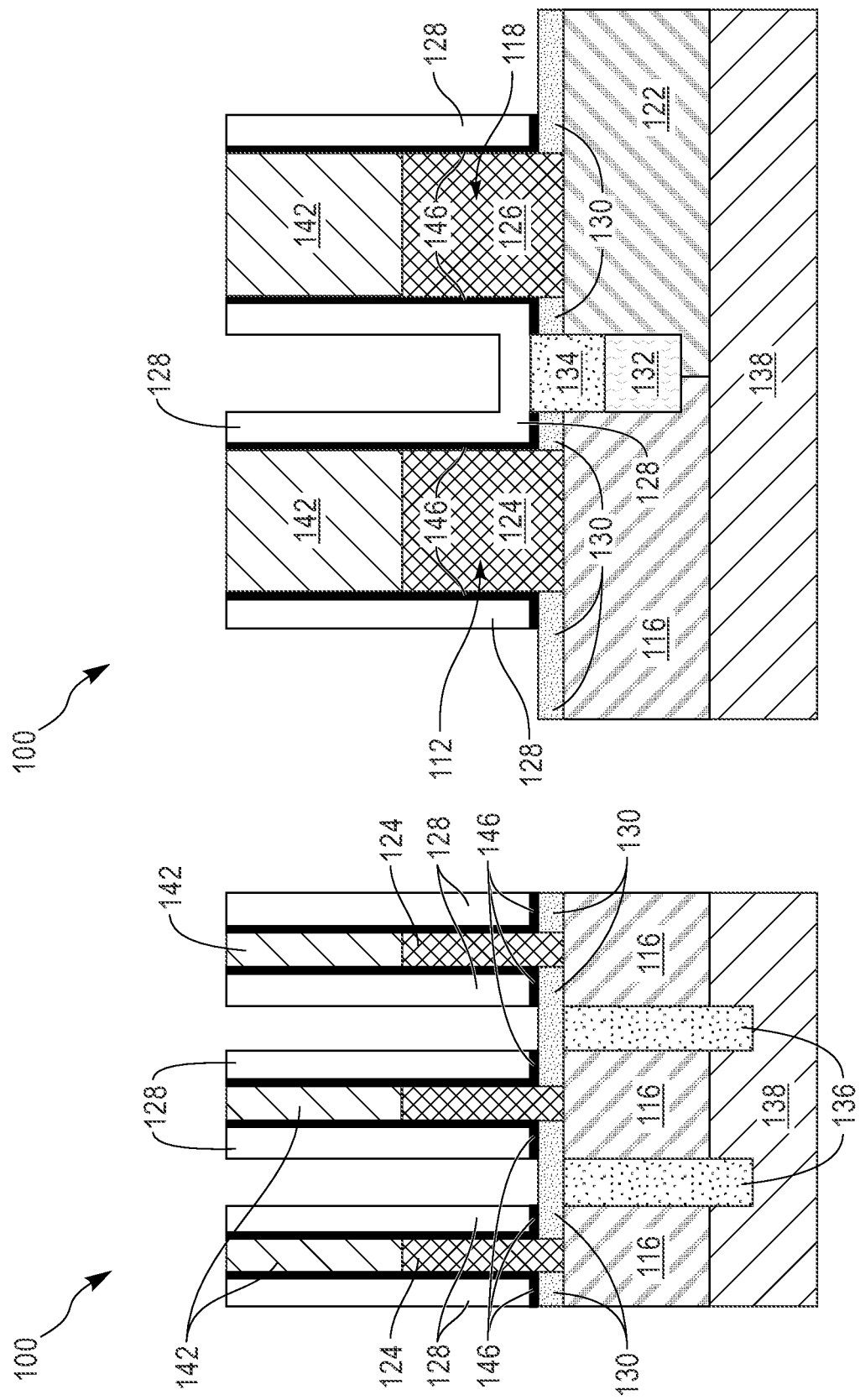

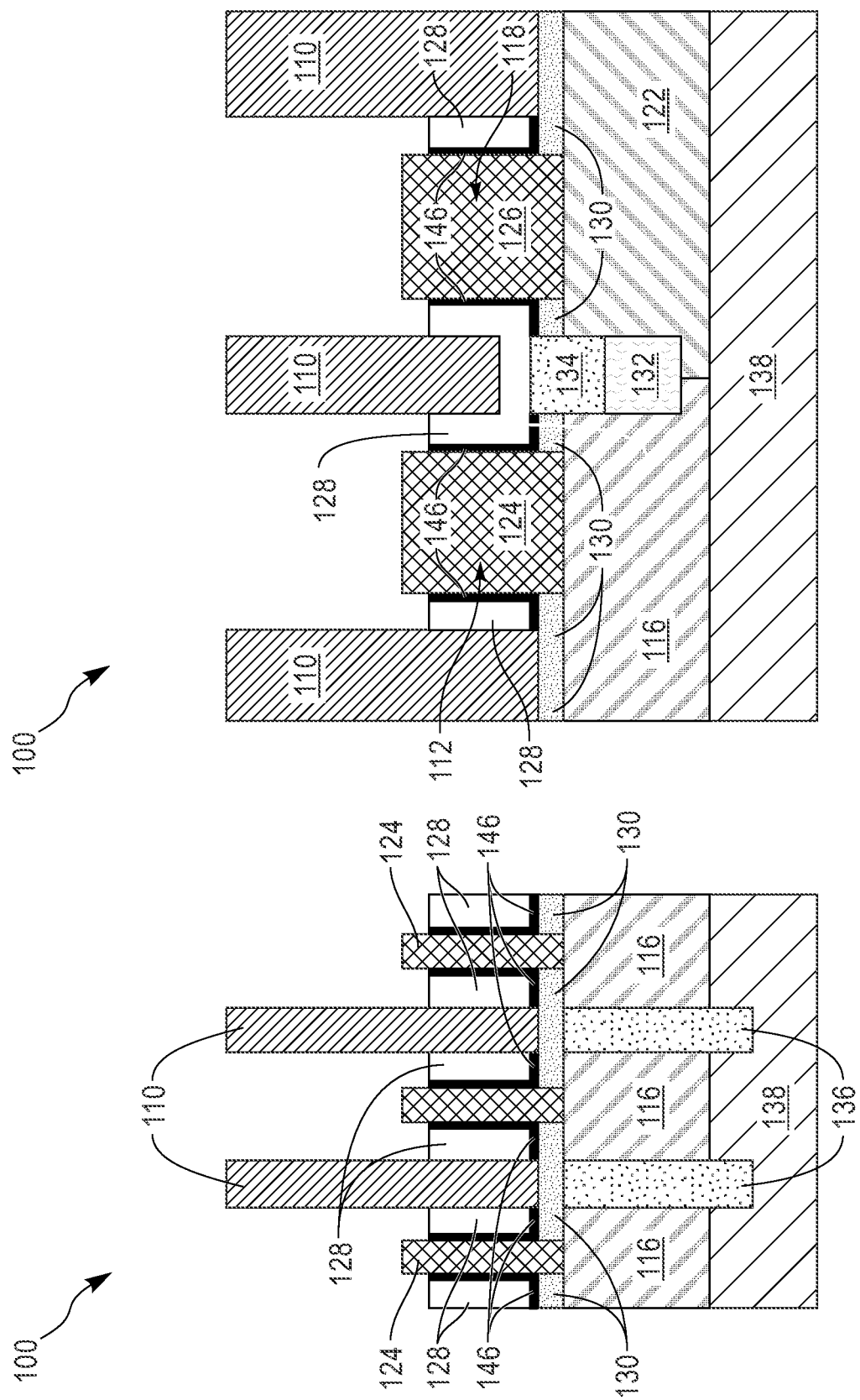

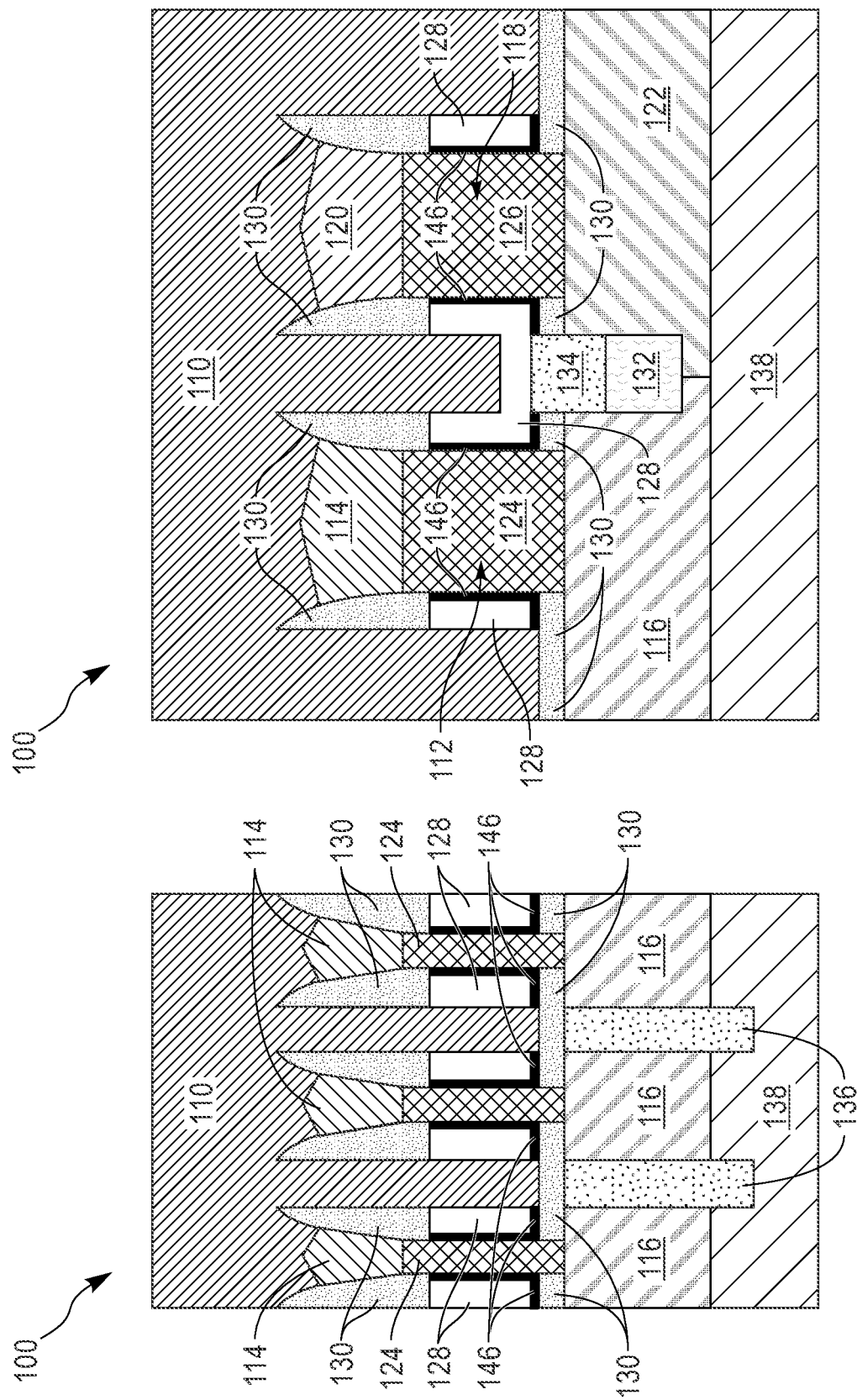

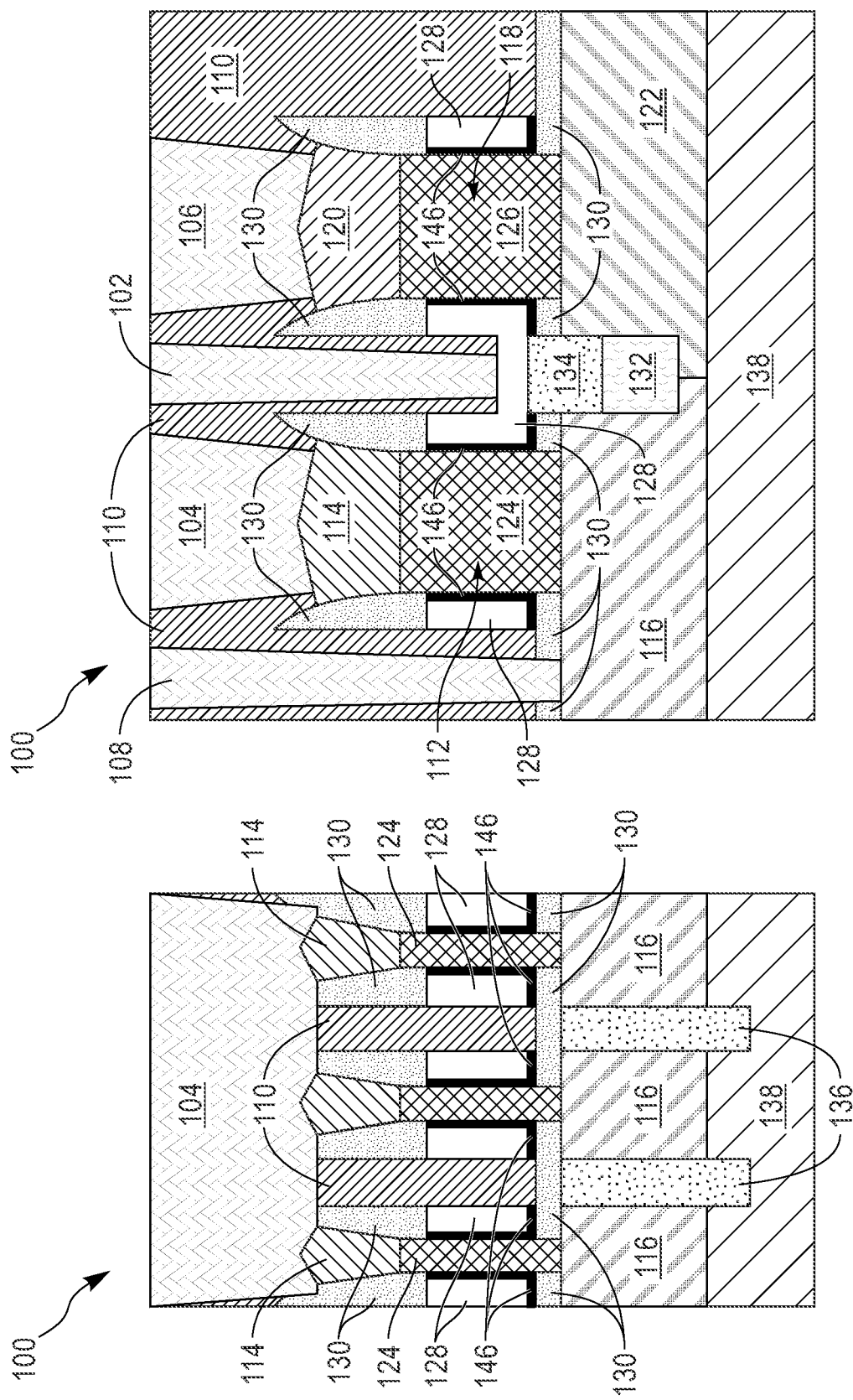

VERTICAL FIELD EFFECT TRANSISTOR INVERTER WITH SINGLE FIN DEVICE

BACKGROUND

The present invention relates generally to the field of vertical field effect transistor (FET) devices and fabrication, and more particularly to the fabrication of a buried contact structure acting as a shared contact between a n-channel FET source/drain and a p-channel FET source/drain for the output signal of an inverter.

A FET typically has a source, a channel, and a drain. A gate controls the flow of current through the channel from the source to the drain. FETs include various structures and orientations of these components. For example, FETs have been fabricated with an orientation of the source, channel, and drain along a major surface of the FET device, such that the current flows horizontally along the substrate. FinFETs include a channel extending outward from the major surface of the substrate, and conducts a current that also flows horizontally from source to drain. A vertical finFET can also be configured with a bottom source/drain in the substrate and a top source/drain on the vertical fin. The current in a vertical finFET flows in a direction perpendicular to the major surface of the substrate. The channel for the finFET can typically be an upright slab of thin rectangular silicon, commonly referred to as the fin with a gate on the fin. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS) device, where a p-channel MOSFET and n-channel MOSFET are coupled together. With ever decreasing device dimensions, forming the individual components and electrical contacts becomes more difficult.

SUMMARY

Embodiments of the invention include a vertical field-effect transistor (VTFET) inverter. The VTFET inverter may include a p-channel field-effect transistor (P-FET) with a P-FET top source/drain and a P-FET bottom source/drain. The VTFET inverter may also include an n-channel field-effect transistor (N-FET) comprising an N-FET top source/drain and a N-FET bottom source/drain. The VTFET inverter may also include a buried contact located at a boundary between the P-FET bottom source/drain and the N-FET bottom source/drain. The VTFET inverter may also include a Vout contact electrically connected to one of the P-FET bottom source/drain and the N-FET bottom source/drain.

Embodiments of the invention also include a method of fabricating a buried contact. The method may include forming a first vertical field-effect transistor (VTFET) fin over a p-channel field-effect transistor (P-FET) bottom source/drain, forming a second VTFET fin over a n-channel field-effect transistor (N-FET) bottom source/drain, forming an N/P buried contact trench between the first VTFET fin and the second VTFET fin, forming a buried contact by filling the N/P buried contact trench with a buried contact material, and forming a Vout contact electrically connected to (i) the P-FET bottom source/drain or (ii) the N-FET bottom source/drain.

Embodiments of the invention also include a method of fabricating a buried contact in a vertical field-effect transistor (VTFET. The method may include forming an N/P buried contact trench between a p-channel field-effect transistor (P-FET) bottom source/drain and a n-channel field-effect transistor (N-FET) bottom source/drain, forming a buried contact by filling the N/P buried contact trench with a buried contact material, depositing a conformal oxide layer over the VTFET until the conformal oxide layer pinches off in the N/P buried contact trench, isotropically etching the conformal oxide layer to form a dielectric cap over the buried contact, forming a Vout contact electrically connected to the P-FET bottom source/drain or the N-FET bottom source/drain.

BRIEF DESCRIPTION OF THE DRAWINGS

FIG. 1 depicts a top-down view of a simplified structure of a vertical field-effect transistor (VTFET) that defines the orientation and identifies planes in which other Figures base their orientation, in accordance with an embodiment of the invention.

FIG. 2 depicts a cross-sectional view, along section line B of FIG. 1 of the VTFET, in accordance with an embodiment of the invention.

FIG. 6A depicts a cross-sectional view, along section line A of FIG. 1, and FIG. 6B depicts a cross-sectional view, along section line B of FIG. 1, of a process of depositing a buried contact within the N/P buried contact trench, in accordance with an embodiment of the invention.

FIG. 9A depicts a cross-sectional view, along section line A of FIG. 1, and FIG. 9B depicts a cross-sectional view, along section line B of FIG. 1, of a process of isotropic oxide etch back of the conformal oxide deposition layer, in accordance with an embodiment of the invention.

FIG. 10A depicts a cross-sectional view, along section line A of FIG. 1, and FIG. 10B depicts a cross-sectional view, along section line B of FIG. 1, of a process of sacrificial titanium nitride removal, in accordance with an embodiment of the invention.

FIG. 11A depicts a cross-sectional view, along section line A of FIG. 1, and FIG. 11B depicts a cross-sectional view, along section line B of FIG. 1, of a process of forming a work function metal, in accordance with an embodiment of the invention.

FIG. 13A depicts a cross-sectional view, along section line A of FIG. 1, and FIG. 13B depicts a cross-sectional view, along section line B of FIG. 1, of a process of removing hard mask material and late gate recess, in accordance with an embodiment of the invention.

FIG. 14A depicts a cross-sectional view, along section line A of FIG. 1, and FIG. 14B depicts a cross-sectional view, along section line B of FIG. 1, of a process of forming top spacers, top source/drain layers, and top inter-layer dielectric, in accordance with an embodiment of the invention.

FIG. 15A depicts a cross-sectional view, along section line A of FIG. 1, and FIG. 15B depicts a cross-sectional view, along section line B of FIG. 1, of a process of forming contacts in an alternative embodiment of the Vout contact, in accordance with an embodiment of the invention.

DETAILED DESCRIPTION

Figure 3B:
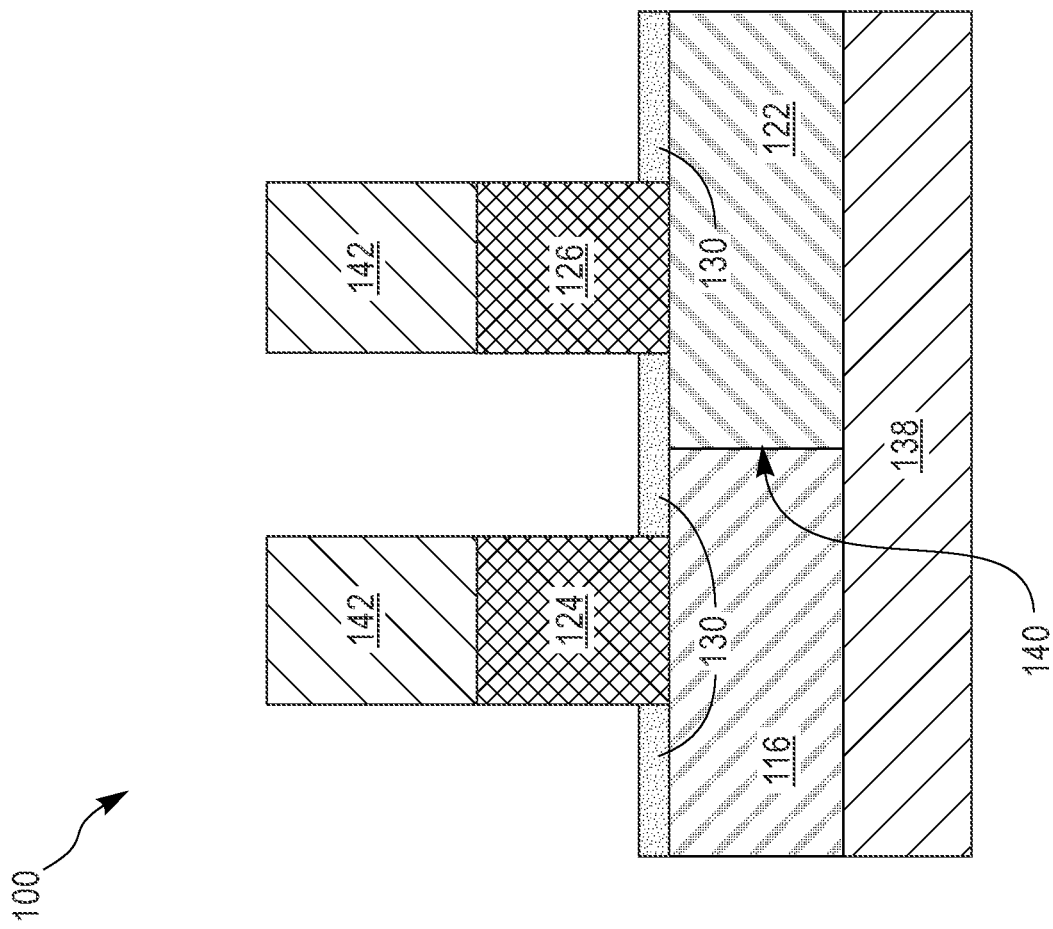
FIG. 3B depicts a cross-sectional view, along section line B of FIG. 1, of a process of forming vertical field-effect transistor (VTFET) fins over field-effect transistor bottom source/drains, in accordance with an embodiment of the invention.

Embodiments of the present invention recognize that for a vertical field-effect transistor (VTFET) having fins, a direct connection between a one top source/drain contact and another top source/drain contact in middle-of-line (MOL) layers of semiconductor devices is not conventionally possible with a single-fin design. Specifically, one fin (e.g., over a p-channel field-effect transistor (P-FET)) cannot connect to another fin (e.g., over a n-channel FET (N-FET)) in-line without contacting a neighboring pair of fins. This is due to the gate contact located between the P-FET and the N-FET.

Embodiments of the present invention, therefore, describe a VTFET device that integrates a buried contact between a P-FET and an N-FET bottom source/drain. The buried contact enables the VTFET to act as an inverter using only a single fin design.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on," "over," or "above" another element, it can be directly on the other element or intervening elements may also be present. In contrast, when an element is referred to as being "directly on" or "directly over" another element, there are no intervening elements present. It will also be understood that when an element is referred to as being "beneath," "under," or "below" another element, it can be directly beneath or under the other element, or intervening elements may be present. In contrast, when an element is referred to as being "directly beneath" or "directly under" another element, there are no intervening elements present. Each reference number may refer to an item individually or collectively as a group. For example, buried contact 132 may refer to a single buried contact 132 or multiple buried contacts 132.

The present invention will now be described in detail with reference to the Figures.

Figure 3A:
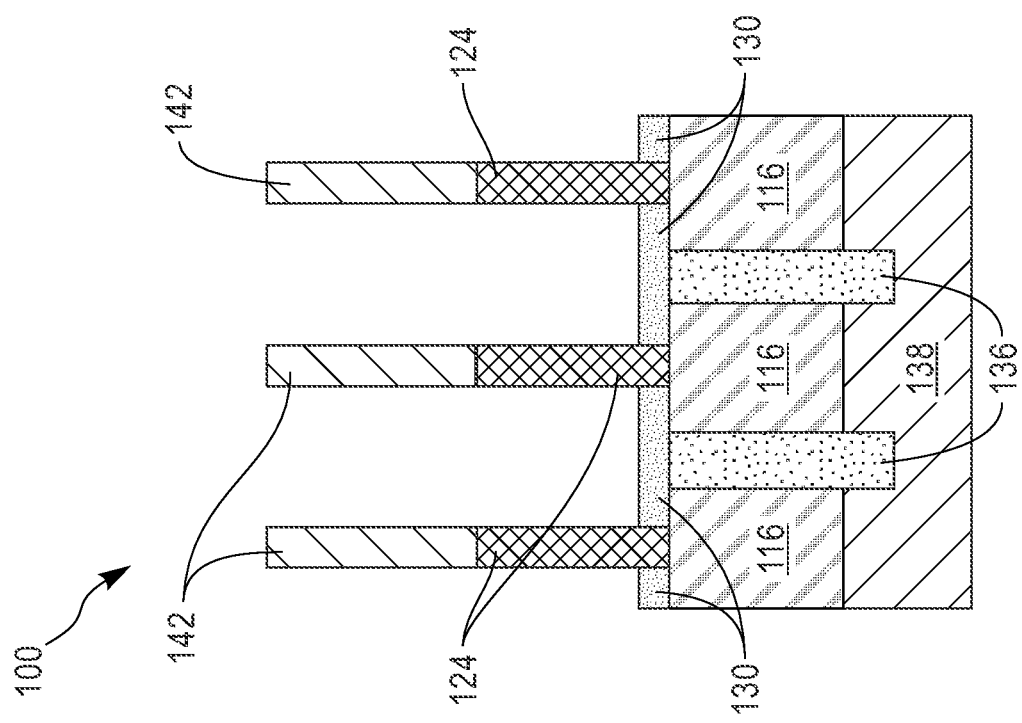
FIG. 3A depicts a cross-sectional view, along section line A of FIG. 1.

FIG. 1 depicts a top-down view of a simplified structure of a vertical field-effect transistor (VTFET) inverter 100. As depicted, the VTFET inverter 100 has contacts for logical operation. Specifically, the VTFET inverter 100 has a gate contact Vin 102, a p-channel supply voltage $V_{DD}$ contact 104, a ground voltage $V_{SS}$ contact 106, and an output voltage Vout contact 108. The gate contact Vin 102 controls the signals through the VTFET inverter 100 which passes from the supply voltage $V_{DD}$ contact 104 to the output voltage Vout contact 108. FIG. 1 also shows section line A and section line B. Section line A and section line B each correspond to cross-sectional views that are used in subsequent Figures to describe the process of making and the resulting structure in accordance with embodiments of the present invention. For example, FIG. 3A is a cross-sectional view along section line A and FIG. 3B is a cross-sectional view along section line B. It should be noted that section line A and section line B are provided for purposes of establishing orientation of the views with regard to the overall structure and that the other Figures described herein do not necessarily correspond to the actual structure that is depicted in FIG. 1.

FIG. 2 depicts a cross-sectional view along section line B of FIG. 1, in accordance with an embodiment of the present invention. FIG. 2 depicts a finished embodiment of a VTFET inverter 100 having a gate contact Vin 102, a p-channel supply voltage $V_{DD}$ contact 104, a ground voltage $V_{SS}$ contact 106, and an output voltage Vout contact 108 in an orientation similar to the locations shown in FIG. 1. The VTFET inverter 100 includes an interlayer dielectric (ILD) 110 that separates the contacts (i.e., 102, 104, 106, and 108) and insulates signals from propagating between the contacts. Directly below the p-channel supply voltage $V_{DD}$ contact 104 is a p-channel field-effect transistor (P-FET) 112 having a P-FET top source/drain 114 and a P-FET bottom source/drain 116. Directly below the ground voltage contact 106 is a n-channel field-effect transistor (N-FET) 118 having an N-FET top source/drain 120 and a N-FET bottom source/drain 122. The P-FET 112 has a P-fin 124 and the N-FET 118 has a N-fin 126. Both fins 124, 126 are surrounded by a gate dielectric and work function metal 128 that facilitates operation of the VTFET inverter 100. When the Vin 102 is charged with a positive voltage above a threshold voltage of the NFET 118, the NFET 118 is turned "on" and PFET is turned "off." The NFET 118 on and the PFET off results in the output voltage Vout 108 being pulled down to ground. When the Vin 102 is charged with a negative voltage above the threshold voltage of PFET 112, the PFET 112 is turned "on" and the NFET 118 is turned "off," which results in the output voltage Vout 108 being pulled up to $V_{DD}$ contact 104.

The VTFET inverter 100 also includes spacers 130 around the fins 124, 126 and a buried contact 132 located at a boundary between the P-FET bottom source-drain 116 and the N-FET bottom source/drain 122. The buried contact 132 enables the VTFET to operate as an inverter, since the P-FET bottom source-drain 116 and the N-FET bottom source/drain 122 are no longer in direct contact, and thus do not form a p-n diode in which the current is only able to flow in one direction. The buried contact 132 has a dielectric cap 134 above the buried contact 132 and between the buried contact 132 and the work function metal 128. The dielectric cap 134 prevent shorting or having high parasitic capacitance between gate 128 and the buried contact 132.

FIG. 3A depicts a cross-sectional view, along section line A of FIG. 1, and FIG. 3B depicts a cross-sectional view, along section line B of FIG. 1, of a process of forming vertical field-effect transistor (VTFET) fins 124, 126 over field-effect transistor bottom source/drains 116, 122, in accordance with an embodiment of the invention. FIG. 3A shows only P-fins 124, which are formed with a minimal distance between to maximize efficiency and compactness of the VTFET inverter 100 and the circuit overall. FIG. 3A also shows a shallow trench isolation (STI) 136 that isolates the P-FET bottom source/drains 116 from one another. The STI 136 penetrates into a substrate 138 over which the bottom source/drains 116, 122 are formed. FIG. 3B shows the P-FET bottom source/drain 116 and the N-FET bottom source/drain 122 directly bordering at a boundary 140. The fins 124, 126 may then be formed by conventional litho patterning and etching process. The hardmask 142 can be used for the FIN patterning and also to protect the FIN top during subsequent bottom S/D epi and STI processes. After FIN is formed, a sacrificial sidewall liner (not shown) can be formed to protect the FIN sidewall, followed by substrate recess and bottom S/D formation. The bottom S/D can be formed by selectively in-situ doped epi growth. After bottom S/D epi is formed, STI region can be defined by litho and etch process, followed by dielectric (such as SiO2) fill and recess.

After formation of the fins 124, 126, the bottom spacer 130 can be formed by either directional dielectric deposition process (such as GCIB SiN dep, or HDP SiN dep), or overfilling with dielectric followed etching it back.

Figures 4A, 4B:
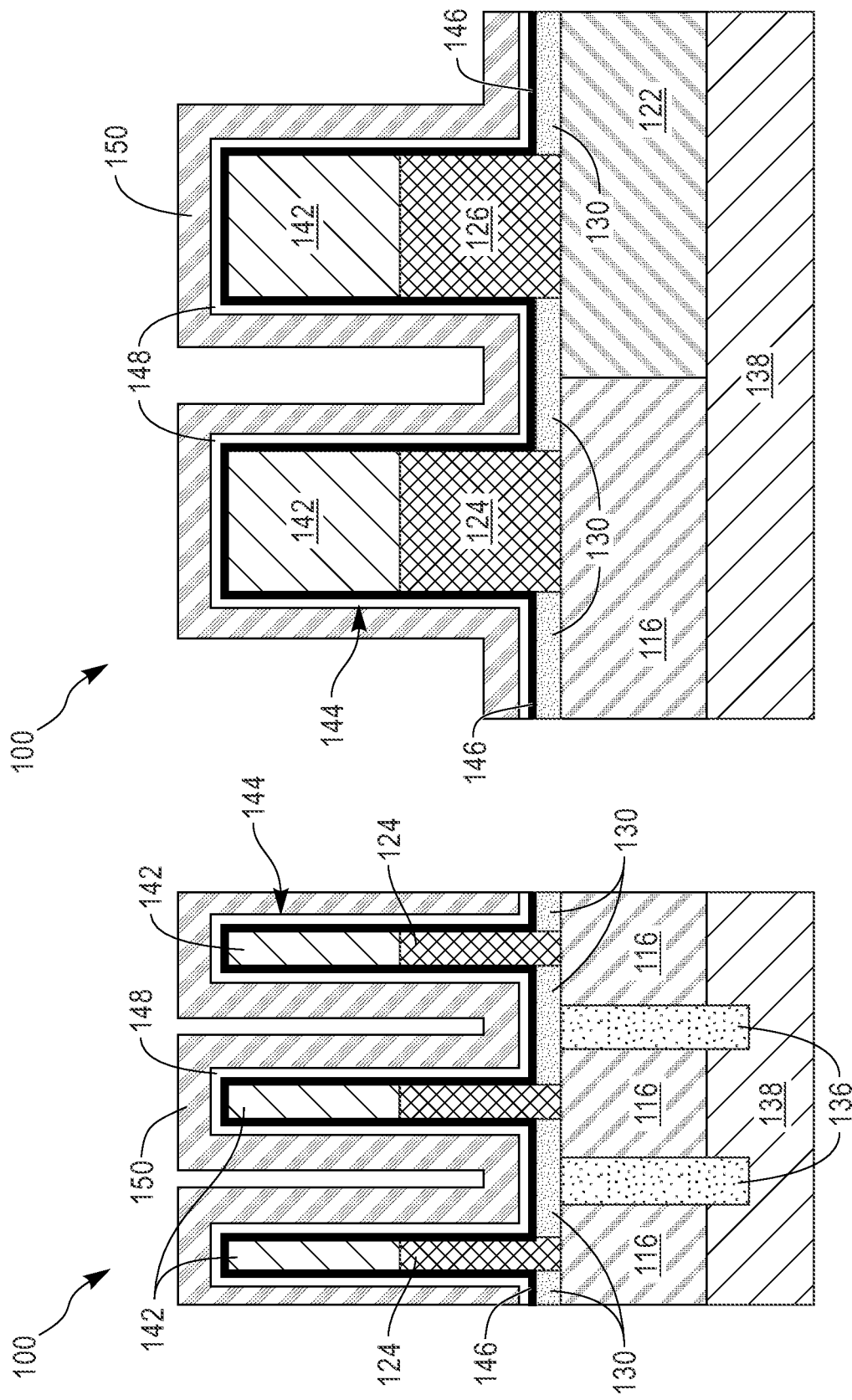
FIG. 4A depicts a cross-sectional view, along section line A of FIG. 1.
FIG. 4B depicts a cross-sectional view, along section line B of FIG. 1, of a process of forming protective layers, in accordance with an embodiment of the invention.

FIG. 4A depicts a cross-sectional view, along section line A of FIG. 1, and FIG. 4B depicts a cross-sectional view, along section line B of FIG. 1, of a process of forming gate dielectric and protective layers 144, in accordance with an embodiment of the invention. The gate dielectric and protective layers 144 include a gate dielectric layer 146, such as hafnium oxide, and its protective layers, including a sacrificial titanium nitride layer 148, and an amorphous silicon layer 150. The formation of these layers may be followed by annealing. The annealing improves reliability of the gate dielectric layer 146, and does so without degrading the property of any contact by reducing the need for any contact or silicide being formed over the bottom S/D 116, 122.

Figures 5A, 5B:
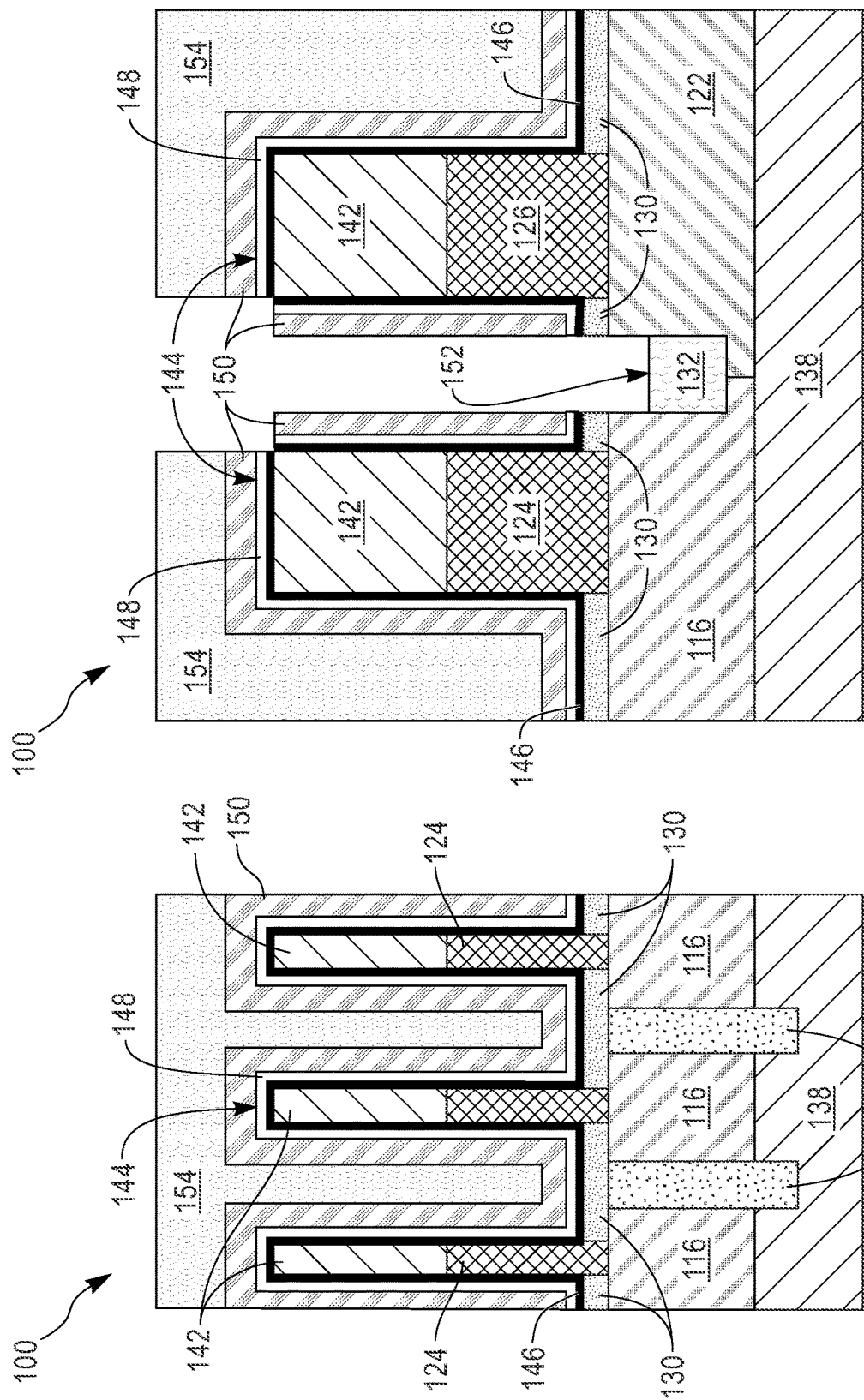
FIG. 5A depicts a cross-sectional view, along section line A of FIG. 1.
FIG. 5B depicts a cross-sectional view, along section line B of FIG. 1, of a process of forming a N/P buried contact trench, in accordance with an embodiment of the invention.

FIG. 5A depicts a cross-sectional view, along section line A of FIG. 1, and FIG. 5B depicts a cross-sectional view, along section line B of FIG. 1, of a process of forming an N/P buried contact trench 152, in accordance with an embodiment of the invention. Formation of the N/P buried contact trench 152 includes masking the gate dielectric layer 146 and protective layers 144 with a masking material 154 and then directionally etching utilizing a directional or anisotropic etching process such as reactive ion etching (RIE). In one example, a plasma dry etch may be used to remove the gate dielectric layer 146 and protective layers 144, the bottom spacer 130, and etching into the bottom source/drains 116, 122 to form the N/P buried contact trench 152.

FIG. 6A depicts a cross-sectional view, along section line A of FIG. 1, and FIG. 6B depicts a cross-sectional view, along section line B of FIG. 1, of a process of depositing the buried contact 132 within the N/P buried contact trench 152, in accordance with an embodiment of the invention. The buried contact 132 may be formed by depositing a layer of conductive material over the VTFET inverter 100 and then selectively etching down the conductive material until the only remaining portion is the buried contact 132 at the bottom of the N/P buried contact trench 152. Other methods of forming the buried contact 132 may also be used within the scope of the disclosed embodiments. The metal deposition may include silicide liner such as Ti, Ni, NiPt, followed by a thin adhesion metal liner such as TiN, followed by bulk metal deposition such as W, Co, Ru, etc. Before metal recess, a planarization process can be used to make the top metal surface flat.

Figure 7B:
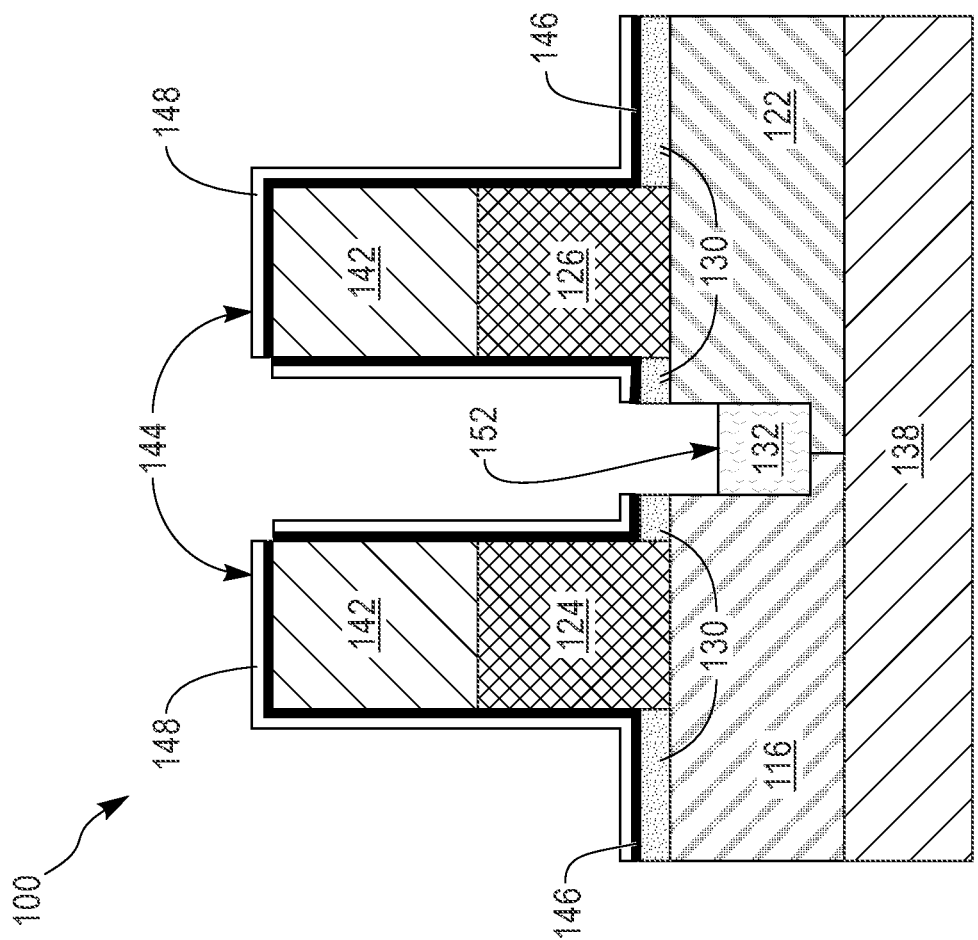
FIG. 7B depicts a cross-sectional view, along section line B of FIG. 1, of a process of removing an amorphous silicon layer from the VTFET, in accordance with an embodiment of the invention.
Figure 7A:
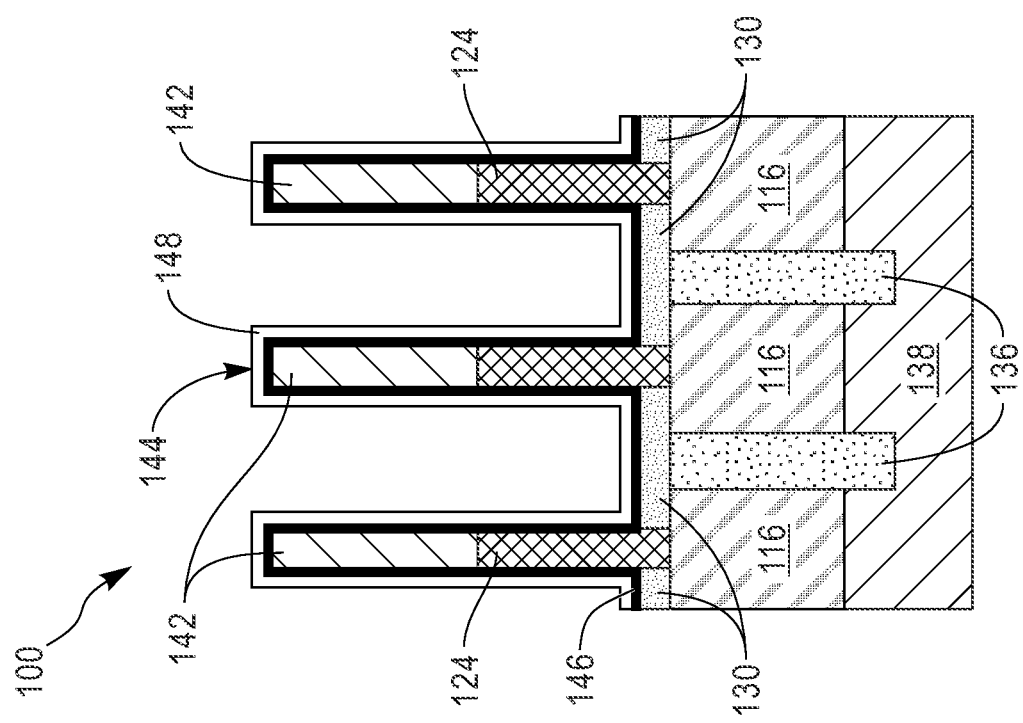
FIG. 7A depicts a cross-sectional view, along section line A of FIG. 1.

FIG. 7A depicts a cross-sectional view, along section line A of FIG. 1, and FIG. 7B depicts a cross-sectional view, along section line B of FIG. 1, of a process of removing the amorphous silicon layer 150 from the VTFET inverter 100, in accordance with an embodiment of the invention. The amorphous silicon layer 150 may be removed using an etch process like an isotropic etching process such as, for example, wet etch or vapor phased dry etch. This etch step can be selective so that only the amorphous silicon layer 150 is etched, while the remaining layers stay for protection or patterning of subsequent process steps. The amorphous silicon 150 was included as a protective layer 144 to protect the fins 124, 126 during the formation of the buried contact 132, since the metal contacting the fins 124, 126 would degrade operation. The amorphous silicon 150 also protected the gate dielectric layer 146 during reliability annealing, preventing it from over growth which can cause a Tox to detrimentally increase.

Figures 8A, 8B:
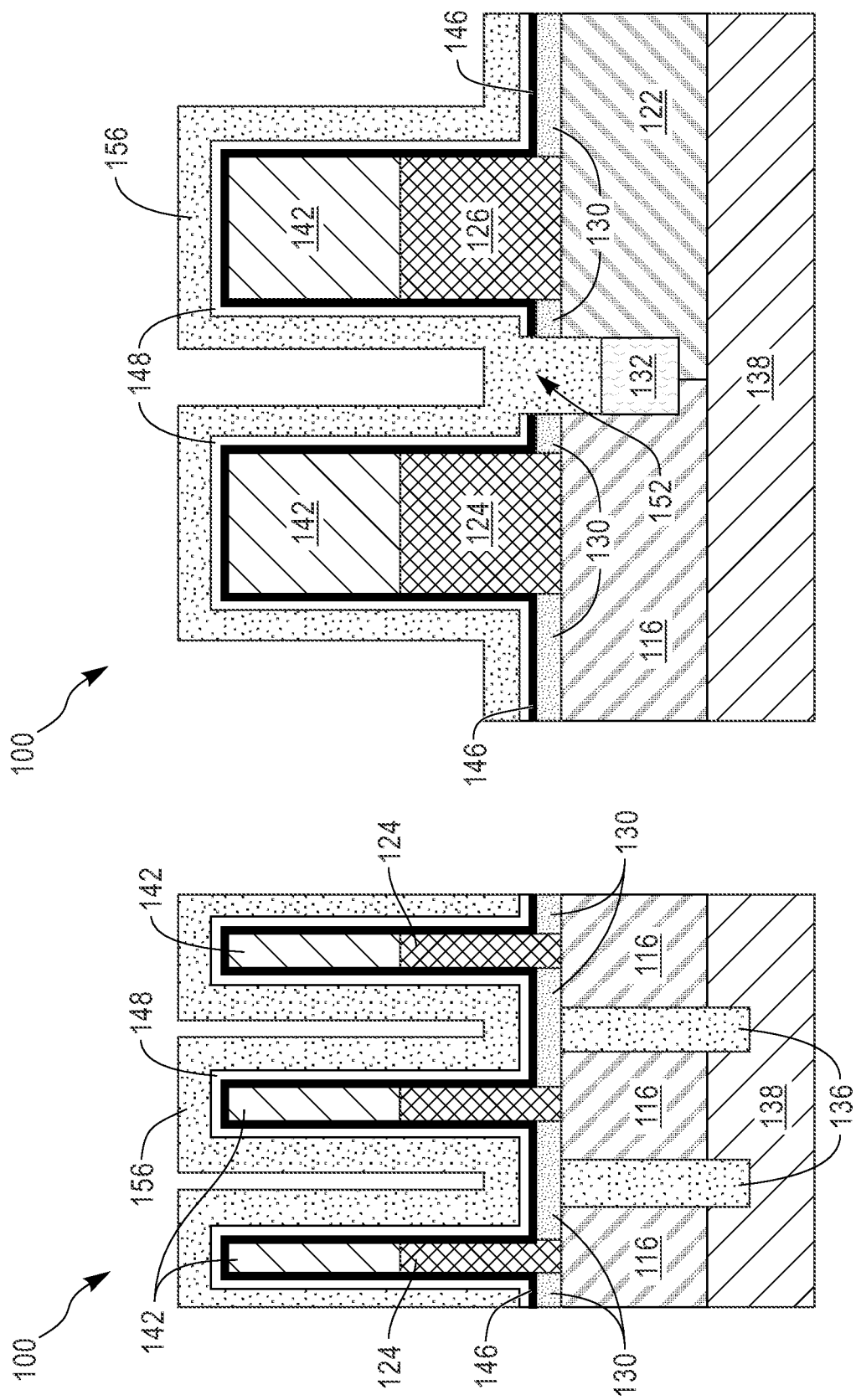
FIG. 8A depicts a cross-sectional view, along section line A of FIG. 1.
FIG. 8B depicts a cross-sectional view, along section line B of FIG. 1, of a process of applying a conformal oxide deposition layer, in accordance with an embodiment of the invention.

FIG. 8A depicts a cross-sectional view, along section line A of FIG. 1, and FIG. 8B depicts a cross-sectional view, along section line B of FIG. 1, of a process of applying a conformal oxide deposition layer 156, in accordance with an embodiment of the invention. The conformal oxide deposition layer 156 is formed as a blanket layer over the VTFET inverter 100. In the N/P buried contact trench 152, however, the conformal oxide deposition layer 156 "pinches off," meaning that the deposition from one side of the N/P buried contact trench 152 contacts the deposition from the other side and completely fills the N/P buried contact trench 152. The pinching off self-aligns the conformal oxide deposition layer 156 to the N/P buried contact trench 152 without masking or patterning of any etch process.

FIG. 9A depicts a cross-sectional view, along section line A of FIG. 1, and FIG. 9B depicts a cross-sectional view, along section line B of FIG. 1, of a process of isotropic oxide etch back of the conformal oxide deposition layer 156, in accordance with an embodiment of the invention. The isotropic etch removes the conformal oxide deposition layer 156 evenly until only the self-aligned portion of the conformal oxide deposition layer 156 forms the dielectric cap 134. Specifically, the dielectric cap 134 forms only in the locations that have been pinched off, which is to say: within the N/P buried contact trench 152. Therefore, the buried contact 132 and the dielectric cap 134 are both formed in a self-aligning manner such that additional masking and/or patterning are not necessary. Additionally, the buried contact 132 and the dielectric cap 134 may be formed after all high temperature annealing steps, such that the silicide formed in the buried contact 132 with respect to the connection with the N-FET bottom source/drain 122 and the P-FET bottom source/drain 116 will not be degraded later due to any subsequent high thermal budget processes.

FIG. 10A depicts a cross-sectional view, along section line A of FIG. 1, and FIG. 10B depicts a cross-sectional view, along section line B of FIG. 1, of a process of removing the sacrificial titanium nitride 148, in accordance with an embodiment of the invention. The sacrificial titanium nitride 148 may be removed by any available etching process, without removing other layers or components of the VTFET inverter 100. The titanium nitride 148 was in place in the process of fabricating the VTFET inverter 100 to protect the fins 124, 126, the bottom source/drains 116, 122, and the hafnium oxide 146 during deposition of etch back of the conformal oxide deposition layer 156 to form the dielectric cap 134.

FIG. 11A depicts a cross-sectional view, along section line A of FIG. 1, and FIG. 11B depicts a cross-sectional view, along section line B of FIG. 1, of a process of forming the work function metal 128, in accordance with an embodiment of the invention. In embodiments of the present invention, the work function metal 128 may be formed by a deposition process followed by an etching process or a selective etching process that selectively removes work function material. In some embodiments, this etching can be performed using an anisotropic etch such as RIE. Masking material (not shown) may be applied to the top of the device prior to etching each contact trench, which resists etching and can be utilized to form the desired shape of the work function metal. In some embodiments, the masking material may be a photoresist which has been patterned using photolithography.

Figures 12A, 12B:
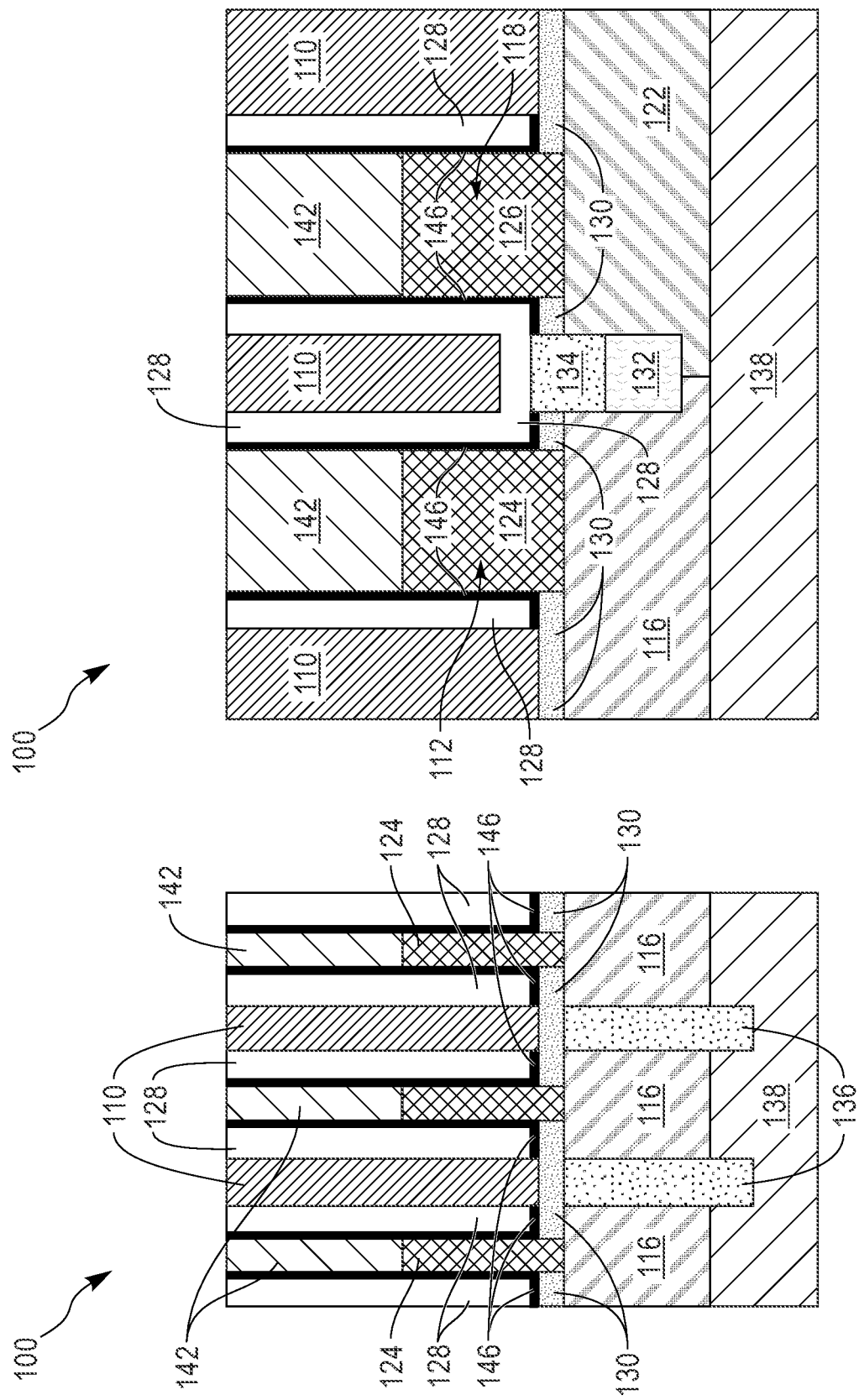
FIG. 12A depicts a cross-sectional view, along section line A of FIG. 1.
FIG. 12B depicts a cross-sectional view, along section line B of FIG. 1, of a process of depositing an inter-layer dielectric and planarizing the VTFET, in accordance with an embodiment of the invention.

FIG. 12A depicts a cross-sectional view, along section line A of FIG. 1, and FIG. 12B depicts a cross-sectional view, along section line B of FIG. 1, of a process of depositing the inter-layer dielectric (ILD) 110 and planarizing the VTFET inverter 100, in accordance with an embodiment of the invention. In general, the ILD 110 may be a non-crystalline solid material such as silicon dioxide ($SiO_2$), undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD 110. The use of a self-planarizing dielectric material as the ILD 110 may avoid the need to perform a subsequent planarizing step.

In some embodiments, the ILD 110 is formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD 110, a planarization process or an etch back process follows the deposition of the dielectric material that provides the ILD 110.

FIG. 13A depicts a cross-sectional view, along section line A of FIG. 1, and FIG. 13B depicts a cross-sectional view, along section line B of FIG. 1, of a process of removing the hard mask 142, in accordance with an embodiment of the invention. The hard mask 142 may be etched utilizing wet etch or dry etch processes, and then the work function metal 128 may be recessed using similar or different etching processes. That is, the work function metal 128 may be etched with the hafnium oxide 146 to a level below the top of the fins 124, 126. This recessing enables the top source/drains 114, 120 to be insulated from the work function metal 128 when formed on top of the fins 124, 126.

FIG. 14A depicts a cross-sectional view, along section line A of FIG. 1, and FIG. 14B depicts a cross-sectional view, along section line B of FIG. 1, of a process of forming top spacers 130, top source/drains 114, 120, and the rest of the ILD 110, in accordance with an embodiment of the invention. The spacers 130 surround the top source/drains 114, 120, which isolates each top source/drain 114, 120 so that a signal passes directly through the top source/drain 114, 120, the fins 124, 126, and the bottom source/drains 116, 122.

FIG. 15A depicts a cross-sectional view, along section line A of FIG. 1, and FIG. 15B depicts a cross-sectional view, along section line B of FIG. 1, of a process of forming contacts 102, 104, 106, 108. The contacts 102, 104, 106, 108 may be formed in the ILD 110 by removing portions of the ILD 110 to form contact trenches. The contact trenches may be formed in the ILD 110 based on the desired size and location of contacts 102, 104, 106, 108.

In embodiments of the present invention, each contact trench may be formed by an etching process or a selective etching process that selectively removes ILD material from the ILD 110 within the trench. In some embodiments, this etching can be performed using an anisotropic etch such as RIE. Masking material (not shown) may be applied to the top of the device prior to etching each contact trench, which resists etching and can be utilized to form the desired shape of the contact trench, such as, for example, the shape depicted in FIG. 2. In some embodiments, the masking material may be a photoresist which has been patterned using photolithography.

Subsequent to creating the contact trenches, contacts 102, 104, 106, 108 may be formed by, for example, depositing a metal layer in the contact trenches. Any known deposition process may be utilized including, for example, CVD, PECVD, PVD, sputtering, ALD or other like deposition processes. Contacts 102, 104, 106, 108 may be formed of a metal such as, for example, tungsten, cobalt, tantalum, hafnium, zirconium, niobium, titanium, titanium nitride, copper, or alloys comprising carbon. Before bulk metal fill, usually a thin adhesion liner is deposited, such as TiN, TaN, etc. After the contact metal used to form contacts 102, 104, 106, 108 is deposited, CMP may be used to remove excess contact material stopping at the top of the ILD 110 such that the top surface of contacts 102, 104, 106, 108 is coplanar with the top surface of the ILD 110.

FIG. 15B further illustrates an alternative embodiment of a configuration for the Vout contact 108, in accordance with an embodiment of the invention. Specifically, the Vout contact 108 is connected to the P-FET bottom source/drain 116 rather than the N-FET bottom source/drain 122. Since the buried contact 132 enables current flow in either direction between the N-FET bottom source/drain 122 and the P-FET bottom source/drain 116, the Vout contact 108 may be located in connection to either bottom source/drain 116, 122.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A vertical field-effect transistor (VTFET) inverter, comprising:
   a p-channel field-effect transistor (P-FET) comprising a P-FET top source/drain (S/D) and a P-FET bottom S/D;
   an n-channel field-effect transistor (N-FET) comprising an N-FET top S/D and a N-FET bottom S/D;
   a buried contact located at a boundary between the P-FET bottom S/D and the N-FET bottom S/D, wherein an entire top surface of the buried contact is below a top surface of the P-FET bottom S/D and a top surface of the N-FET bottom S/D; and
   a Vout contact electrically connected to one of the P-FET bottom source/drain and the N-FET bottom S/D.

2. The VTFET inverter of claim 1, wherein the P-FET top S/D electrically connects to a $V_{DD}$.

3. The VTFET inverter of claim 1, wherein the N-FET top S/D electrically connects to a $V_{SS}$.

4. The VTFET inverter of claim 1, comprising a gate contact Vin electrically connected between the P-FET top S/D and the N-FET top S/D.

5. The VTFET inverter of claim 4, comprising a dielectric cap between the buried contact and the gate Vin contact.

6. The VTFET inverter of claim 5, comprising a work-function metal directly contacting the gate contact Vin and the dielectric cap.

7. The VTFET inverter of claim 1, wherein the Vout contact is connected at a side of the P-FET bottom S/D or the N-FET bottom S/D that is opposite from the buried contact.

* * * * *